United States Patent
Zhang et al.

(10) Patent No.: US 9,899,430 B2
(45) Date of Patent: Feb. 20, 2018

(54) GOA UNIT AND METHOD FOR PRODUCING THE SAME, GATE DRIVER CIRCUIT

(71) Applicants: BOE Technology Group Co., Ltd., Beijing (CN); Beijing BOE Display Technology Co., Ltd., Beijing (CN)

(72) Inventors: Xiaoxiang Zhang, Beijing (CN); Tsung Chieh Kuo, Beijing (CN); Zheng Liu, Beijing (CN); Zhichao Zhang, Beijing (CN); Mingxuan Liu, Beijing (CN); Xi Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/089,815

(22) Filed: Apr. 4, 2016

(65) Prior Publication Data
US 2016/0322401 A1 Nov. 3, 2016

(30) Foreign Application Priority Data

Apr. 29, 2015 (CN) .......................... 2015 1 0213267

(51) Int. Cl.
*H01L 27/12* (2006.01)
*H01L 49/02* (2006.01)
*H01L 29/417* (2006.01)

(52) U.S. Cl.
CPC ........ *H01L 27/1255* (2013.01); *H01L 27/124* (2013.01); *H01L 27/1288* (2013.01);
(Continued)

(58) Field of Classification Search
CPC .................. H01L 27/1255; H01L 27/1288
See application file for complete search history.

(56) References Cited

U.S. PATENT DOCUMENTS 4,884,079 A * 11/1989 Inoue ................. G06K 15/1238
347/136
5,837,582 A * 11/1998 Su .......................... H01L 28/84
257/E21.013
(Continued)

FOREIGN PATENT DOCUMENTS

CN          102447074 A          5/2012
CN          102903857 A          1/2013

OTHER PUBLICATIONS

First Office Action from Chinese Patent Application No. 201510213267.3, dated Jun. 2, 2017, 11 pages.

*Primary Examiner* — Tom Thomas
*Assistant Examiner* — Vincent Wall
(74) *Attorney, Agent, or Firm* — Westman, Champlin & Koehler, P.A.

(57) ABSTRACT

Embodiments of the present disclosure provide a GOA unit and a method for producing the same and a gate driver circuit, which are directed to a field of display technique. The GOA unit includes: a TFT module and a capacitor structure formed on a substrate. The TFT module includes a gate electrode, a source electrode and a drain electrode, and the capacitor structure includes a first electrode and a second electrode configured to form a first capacitor. The gate of the TFT module is located in a same layer as the first electrode of the capacitor structure, the source electrode and the drain electrode of the TFT module are located in a same layer as the second electrode of the capacitor structure, and the second electrode has a groove. Embodiments of the present application are used for a display apparatus.

13 Claims, 12 Drawing Sheets

(52) U.S. Cl.
CPC .............. *H01L 28/82* (2013.01); *H01L 28/88* (2013.01); *H01L 29/41733* (2013.01)

(56) References Cited

U.S. PATENT DOCUMENTS

| | | | |
|---|---|---|---|
| 6,285,050 B1* | 9/2001 | Emma | H01L 27/0688 |
| | | | 257/296 |
| 8,378,352 B2 | 2/2013 | Lee et al. | |
| 8,716,778 B2* | 5/2014 | Chen | H01L 23/5223 |
| | | | 257/303 |
| 8,822,999 B2 | 9/2014 | Choi et al. | |
| 2005/0231656 A1* | 10/2005 | den Boer | H01L 27/14609 |
| | | | 349/42 |
| 2006/0145157 A1* | 7/2006 | Choi | G02F 1/13458 |
| | | | 257/66 |
| 2007/0059879 A1 | 3/2007 | Ting | |
| 2012/0080663 A1 | 4/2012 | Lee et al. | |
| 2013/0105801 A1 | 5/2013 | Lee et al. | |

* cited by examiner

GOA UNIT AND METHOD FOR PRODUCING THE SAME, GATE DRIVER CIRCUIT

CROSS-REFERENCE TO RELATED APPLICATION

This application claims the benefit of Chinese Patent Application No. 201510213267.3 entitled "GOA Unit and Method for Producing the Same, Gate Driver Circuit", filed on Apr. 29, 2015 in the State Intellectual Property Office of China, the whole disclosure of which is incorporated herein by reference.

BACKGROUND OF THE INVENTION

Field of the Invention

The present application relates to a technical field of display, more particular to a GOA unit, a method for producing the same, and a gate driver circuit including the GOA unit.

Description of the Related Art

GOA (Gate Driver on Array) technique is one of gate driver techniques for liquid crystal panels, a basic concept of which is to integrate a gate driver circuit of the liquid crystal panel into an array substrate, so as to form a row scan driver for the liquid crystal panel. The GOA technique not only can save the cost, but also can achieve an aesthetic design of the liquid crystal panel to be symmetric for two sides thereof. It also can save up a welding area of the gate driver circuit, and thus can obtain a narrow frame design.

In the prior art, FIG. 1 is a schematic top view of a GOA unit. As shown in FIG. 1, the GOA unit includes a TFT (Thin Film Transistor) module and a capacitor module. FIG. 2 is a schematic sectional view of an area 01 along a line A-A' and an area 02 along a line B-B' in FIG. 1, taking a bottom gate type TFT as an example. As shown in FIG. 2, a method for producing the GOA unit is to manufacture a gate 111 on substrate 10 in a first conductive layer pattern, a first electrode 112 on substrate 10, an insulation layer 12, a semiconductor layer 13 and a source electrode 141, a drain electrode 142 and a second electrode 143 in the second conductive layer pattern in sequence. There is a channel 144 between the source electrode 141 and the drain electrode 142, and the first electrode 112 and the second electrode 143 form a capacitor structure.

When the second conductive layer pattern of the TFT module is manufactured in the prior art, one commonly used method is to expose a conductive layer coated with photo resist by a mask and then develop it, so that the photo resist at a region corresponding to the second conductive layer pattern is fully reserved, the photo resist at a region corresponding to the channel 144 of the TFT module is half reserved, but the photo resist at other regions is fully removed; and the conductive layer and the semiconductor layer 13 at the region where the photo resist is fully removed are etched away. However, when a layer of the photo resist is exposed by the mask and developed, as the development operation proceeds, it is necessary to reduce a thickness of the photo resist of the region corresponding to the channel 144 where the photo resist is half conserved, and it is necessary to keep a constant thickness of the photo resist of the region corresponding to the second electrode 143 where the photo resist is fully reserved. Since the second electrode 143 is of an integral structure having a relatively large area, the photo resist corresponding to the second electrode 143 is of an integral structure. Due to this, more developer liquid will flow toward the channel 144 having the photo resist of small thickness. It will cause amount of the developer liquid at the photo resist of the region corresponding to the channel 144 to increase. In this way, too much developer liquid accumulated at the region corresponding to the channel 144 will develop the photo resist of the region corresponding to two sides of the channel 144, and thus a part of the photo resist at the source and drain electrodes 141 and 142 where the photo resist is fully reserved is developed and removed. Furthermore, in the subsequent etching process, a part of the conductive layer and the semiconductor layer 13 located at the region where the part of the photo resist is developed and removed at the source and drain electrodes 141 and 142, is etched away. Consequently, the source and drain electrodes 141 and 142 are narrowed while the channel of TFT is widened.

SUMMARY OF THE INVENTION

Embodiments of the present application provide a GOA unit and a method for producing the same, a gate driver circuit. It can prevent the problem that TFT channel becomes excessively wide, since too much developer liquid flows toward an area of the TFT unit during the development process due to the presence of the capacitor in the GOA unit.

In order to achieve the object, the embodiments of the present application adopt the following technical solutions:

One aspect of the present embodiment provides a GOA unit including: a TFT module and a capacitor structure formed on a substrate, wherein the TFT module comprises a gate electrode, a source electrode and a drain electrode, and the capacitor structure comprises a first electrode and a second electrode configured to form a first capacitor; wherein the gate electrode of the TFT module is located in a same layer as the first electrode of the capacitor structure, the source electrode and the drain electrode of the TFT module are located in a same layer as the second electrode of the capacitor structure, and the second electrode has a groove.

In an embodiment, the second electrode has a plurality of the grooves, and a distribution density of the grooves is equivalent to that of channels of the TFT module.

In an embodiment, the grooves are distributed evenly.

In an embodiment, a surface of the second electrode away from the first electrode is formed with a protection layer and a third electrode in sequence, the first electrode and the third electrode are configured to form a second capacitor, the protection layer is provided with a via hole therein, and the second electrode is electrically connected with the third electrode by the via hole.

In an embodiment, the third electrode is made of ITO material.

In an embodiment, the third electrode is made of ITO material.

Another aspect of an embodiment of the present invention provides a gate driver circuit, comprising the GOA unit as described in any one of above embodiments.

A further aspect of an embodiment of the present invention provides a display device including a gate driver circuit as described in the above embodiment.

A yet further aspect of an embodiment of the present invention provides a method for producing a GOA unit comprising:

forming onto a substrate a first conductive layer pattern comprising a first electrode of a capacitor structure and a gate electrode of a TFT module;

forming an insulation layer covering the first conductive layer pattern; and forming a semiconductor layer pattern comprising an active layer pattern at a position on the insulation layer corresponding to the gate electrode, and forming a second conductive layer pattern comprising a second electrode of the capacitor structure and source and drain electrodes of the TFT module, wherein the second electrode and the first electrode are configured to form a first capacitor, and the second electrode has a groove.

In an embodiment, the step of forming a semiconductor layer pattern comprising an active layer pattern at a position on the insulation layer corresponding to the gate electrode, and forming a second conductive layer pattern comprising a second electrode of the capacitor structure and source and drain electrodes of the TFT module comprises:

manufacturing onto the insulation layer a semiconductor layer and a conductive layer covering the semiconductor layer in sequence;

forming a photoresist layer onto the conductive layer;

exposing the photoresist layer by a gray tone mask or a half tone mask to a light and developing it so that the photoresist within an area corresponding to the second conductive layer pattern is fully reserved, the photoresist within an area corresponding to a channel pattern of the TFT module is half reserved, and the photoresist within an area corresponding to the remaining regions is fully removed;

etching off the conductive layer and the semiconductor layer within an area corresponding to the area in which the photoresist has been fully removed;

removing the photoresist within the area in which the photoresist has been half reserved by an ashing process, and thinning the photoresist within the area in which the photoresist has been fully reserved;

etching the conductive layer within the area in which the photoresist has been half reserved to form a channel pattern of the TFT module; and peeling off the photoresist to obtain the semiconductor layer pattern comprising the active layer pattern and the second conductive layer pattern comprising the second electrode of the capacitor structure and the source and drain electrodes of the TFT module.

In an embodiment, the step of forming a semiconductor layer pattern comprising an active layer pattern at a position on the insulation layer corresponding to the gate electrode, and forming a second conductive layer pattern comprising a second electrode of the capacitor structure and source and drain electrodes of the TFT module further comprises:

forming a protection layer covering the second conductive layer pattern, wherein the protection layer is formed with a via hole therein;

forming on the protection layer a third conductive layer pattern comprising a third electrode, and electrically connecting the second electrode with the third electrode by the via hole in the protection layer, wherein the third electrode and the first electrode are used to form a second capacitor.

A further aspect of an embodiment of the present invention provides a method for producing a GOA unit comprising:

forming onto a substrate a second conductive layer pattern comprising a second electrode of a capacitor structure and source and drain electrodes of a TFT module, wherein the second electrode of the capacitor structure has a groove;

forming a semiconductor layer pattern comprising an active layer pattern;

forming an insulation layer covering the semiconductor layer pattern; and forming onto the substrate formed with the insulation layer a first conductive layer pattern comprising a first electrode of the capacitor structure and a gate electrode of the TFT module, wherein the first electrode and the second electrode are used to form a first capacitor.

In an embodiment, before forming onto a substrate a second conductive layer pattern comprising a second electrode of a capacitor structure and source and drain electrodes of a TFT module, the method further comprises:

forming onto the substrate a third conductive layer pattern comprising a third electrode;

forming a protection layer covering the third conductive layer pattern, wherein the protection layer is formed with a via hole in an area on which the second electrode is to be formed;

the step of forming onto a substrate a second conductive layer pattern comprising the second electrode of the capacitor structure and source and drain electrodes of the TFT module further comprises:

forming the second electrode and the source electrode of the TFT module on the protection layer, and electrically connecting the second electrode with the third electrode by the via hole.

Embodiments of the present application provide the GOA unit and the method for producing the same, the gate driver circuit and the display apparatus. The GOA unit includes a TFT module and a capacitor structure formed on a substrate, wherein the TFT module comprises a gate electrode, a source electrode and a drain electrode, and the capacitor structure comprises a first electrode and a second electrode configured to form a first capacitor; wherein the gate of the TFT module is located at a same layer as the first electrode of the capacitor structure, the source electrode and the drain electrode of the TFT module are located at a same layer as the second electrode of the capacitor structure, and the second electrode has a groove.

As compared with the prior art, an embodiment of the present application provides the GOA unit, the second electrode of which is provided with grooves, so that during manufacturing the second electrode, when the photoresist layer corresponding to the second electrode is exposed to the light by a mask and is developed, the developer liquid will flow toward a photoresist region corresponding to the grooves of the second electrode, rather than flowing to another photoresist region corresponding to channels too much. Therefore, too much developer liquid will not be accumulated at the region corresponding to the channel, and further the photoresist at the region corresponding to the two sides of the channels would not be developed by too much developer liquid. Thus, it can prevent the problem of the TFT having too wide channels.

BRIEF DESCRIPTION OF THE DRAWINGS

In order to more clearly explain technical solutions in the present embodiments and in the prior art, the drawings used therein are briefly set out below. It is obvious that the accompanying drawings are only directed to some embodiments of the present application. The ordinary skilled person in the art can also obtain other drawings based on these figures without any creative efforts.

DETAINED DESCRIPTION OF PREFERRED EMBODIMENTS OF THE INVENTION

Below, technical solutions of embodiments of the present application are clearly and fully described with reference to the drawings directed to the present embodiments. Obviously, the described embodiments herein are only a part of, not all embodiments of the present application. On basis of the embodiments of the present application, all other embodiments which can be obtained by the ordinary skilled person in the art without any creative efforts, shall fall within the scope of the present application.

Figure 1:
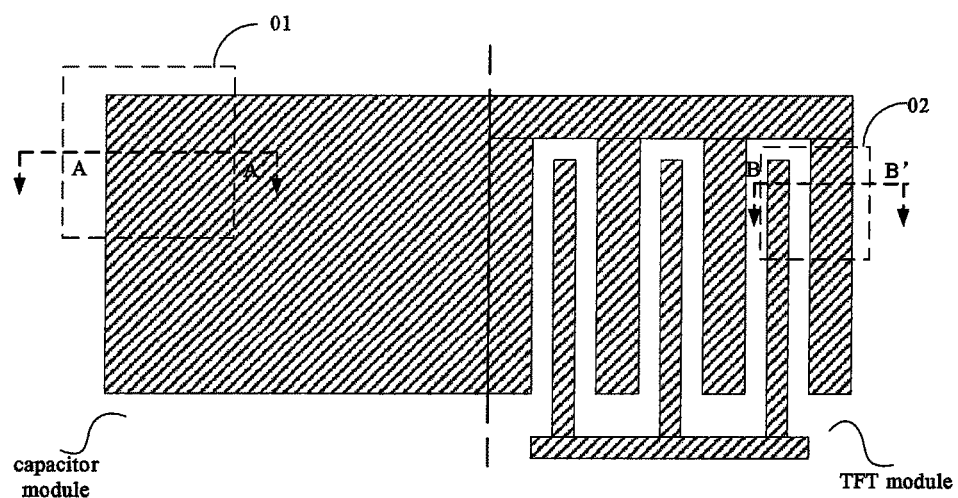
FIG. 1 is a schematic top view of a GOA unit in the prior art.
Figure 2:
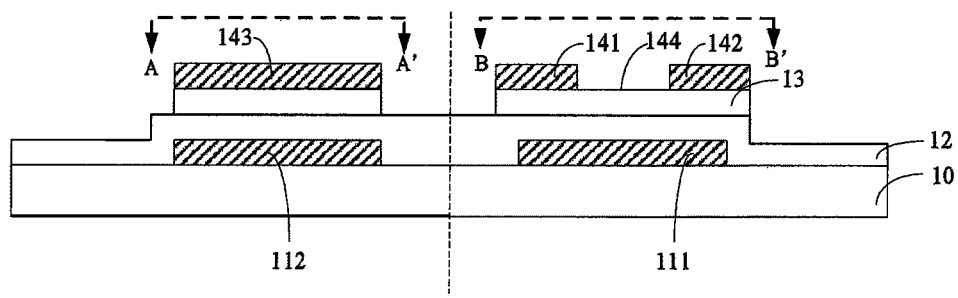
FIG. 2 is a schematic sectional view of the GOA unit in the prior art.
Figure 3:
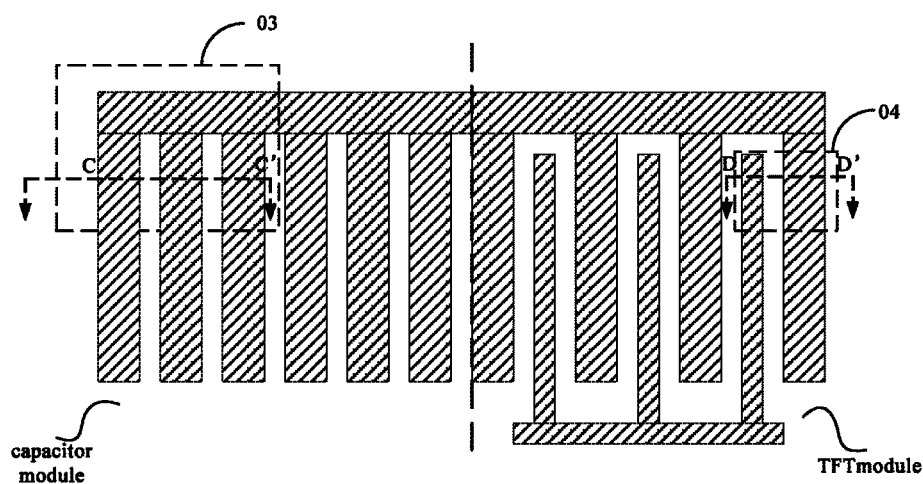
FIG. 3 is a schematic top view of a GOA unit in accordance with an embodiment of the present application.
Figure 4:
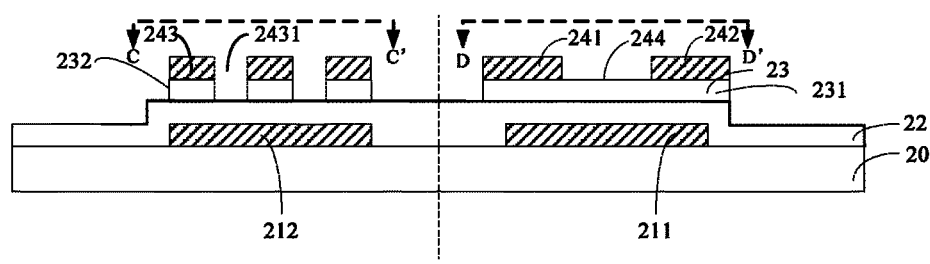
FIG. 4 is a schematic sectional view taken along a line C-C' and a line D-D' in FIG. 3.

As shown in FIGS. 3 and 4, an embodiment of the present application provides a GOA unit, and FIG. 4 is a schematic sectional view of a region 03 taken along a line C-C' and another region 04 taken along another line D-D' respectively. The GOA unit includes a TFT module and a capacitor structure formed on a substrate 20. The TFT module includes a gate electrode 211, a first portion of an insulation layer 22, a first portion 231 of a semiconductor layer 23, a source electrode 241 and a drain electrode 242. The capacitor structure includes a first electrode 212 a second portion of the insulation layer 22, a second portion 232 of the semiconductor layer 23 and a second electrode 243 to form a first capacitor. A gate electrode 211 of the TFT module is located in the same layer as the first electrode 212 of the capacitor structure, the source electrode 241 and the drain electrode 242 of the TFT module are located in the same layer as the second electrode 243 of the capacitor structure, and the second electrode 243 has grooves 2431.

The substrate 20 may be a transparent substrate made of materials such as glass or transparent resin. The present application is not intended to limit the material of the substrate 20 in any ways. Of course, the substrate 20 may further include a film layer, for example an insulation layer, on the transparent substrate made of materials such as glass or transparent resin, according to needs for design and manufacturing.

In the present application, at least two patterns located in the same layer means that such at least two patterns are obtained by a patterning process or patterning processes by one same film layer. Please be noted that the same film layer may include one or more layers of films. Illustratively, with reference to FIG. 4, the gate electrode 211 of the TFT module is located in the same layer as the first electrode 212 of the capacitor structure. Therefore, the gate electrode 211 and the first electrode 212 can be formed onto the first conductive layer by the patterning process, and then an insulation layer 22 is deposited and formed thereon. Because the source electrode 241 and the drain electrode 242 of the TFT module is located in the same layer as the second electrode 243 of the capacitor structure, the source electrode 241, the drain electrode 242 and the second electrode 243 can be formed onto the second conductive layer by the patterning process.

The above groove 2431 may have a side wall to be open at one end thereof. Of course, it may also have a side wall to be closed. In addition, an embodiment of the present application is not intended to limit a shape and an area of the groove 2431 in any ways. Illustratively, the groove may be a cuboid, a cube or a trapezoid platform and the like. That as shown in FIGS. 3 and 4 is only one of all possible shapes.

Please be noted that TFT provided by FIG. 4 is of a structure having a bottom gate, i.e., the gate electrode 211 is closer to the substrate 20 with respect to the source electrode 241 and the drain electrode 242. Specifically, as shown in FIG. 4, the TFT includes the gate electrode 211, the insulation layer 22, the first portion 231 of the semiconductor layer 23, and the source electrode 241 and the drain electrode 242 onto the semiconductor layer 23 provided in sequence on the substrate 20. Of course, another embodiment of the present application provides a TFT having a structure of top gate type, i.e., the active source layer is provided between the substrate and the insulation layer, and the gate electrode is formed on the insulation layer. This case will be explained in the following embodiments of the present application. The explanation will be made taking the TFT of bottom gate type as an example.

In this way, as compared over the prior art, an embodiment of the present application provides the GOA unit, the second electrode of which is provided with grooves, so that during manufacturing the second electrode, when the photoresist layer corresponding to the second electrode is exposed to the light by a mask and is developed, the developer liquid will flow toward a photoresist region corresponding to the grooves of the second electrode, rather than flowing to another photoresist region corresponding to channels excessively. Therefore, too much developer liquid will not be accumulated at the region corresponding to the channel, and further the photoresist at the region corresponding to the two sides of the channels would not be developed by too much developer liquid. Thus, it can prevent the problem of the TFT having too wide channels.

Further, with reference to FIG. 3, there are a plurality of grooves and the grooves have a distribution density equivalent to that of the TFT modules.

The grooves can be provided onto the second electrode, and the present embodiment is not intended to limit the number of the grooves in any ways, and the grooves can accommodate more developer liquid, thereby preventing too much developer liquid flowing toward the channel region. In one embodiment, the distribution density of the grooves is equivalent to that of the channels of the TFT modules, i.e., the distribution number of the grooves is equivalent to that of the channels, and spacing between adjacent grooves is equivalent to that between adjacent channels. In this way, it may further prevent the developer liquid of the capacitor module and the TFT module flowing toward each other. Therefore, the developer liquid in the groove region of the capacitor module and in the channel region of the TFT module is uniform, thereby obtaining relatively even development.

In one embodiment, the plurality of grooves are uniformly distributed. In this way, amount of the developer liquid flowing toward respective groove regions is substantially even, and thus all of the groove regions have an equal development degree.

Figure 5:
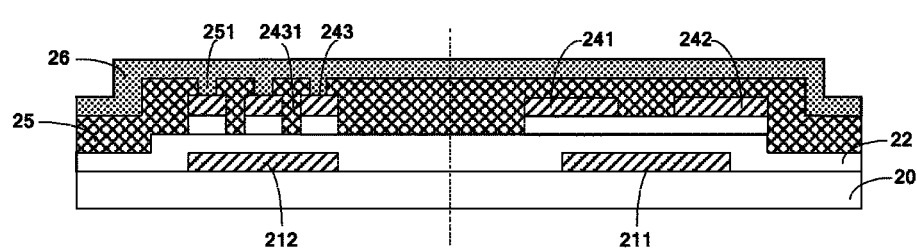
FIG. 5 is a schematic sectional view of a GOA unit in accordance with another embodiment of the present application.

Further, as shown in FIG. 5, a protection layer 25 and a third electrode 26 are formed in sequence onto a surface of the second electrode 243 away from the first electrode 212, and the first electrode 212 and the third electrode 26 are used to form a second capacitor. The protection layer 25 is provided with via holes 251, and the second electrode 243 and the third electrode 26 are electrically connected together by the via holes 251.

Since the ITO (Indium Tin-Oxide) film has advantages such as high electrical conductivity and high light transmissivity, it is preferable to make the third electrode by the ITO material.

Because a plurality of the grooves 2431 are provided on the second electrode 243, and the regions of the grooves 2431 cannot constitute a capacitor structure with the first electrode 212, the first capacitor formed by the first electrode 212 and the second electrode 243 is relatively small. A third electrode 26 is provided onto a surface of the second electrode 243 away from the first electrode 212, and the first electrode 212 and the third electrode 26 are used to form a second capacitor. The second capacitor is added so as to ensure the capacitance of the entire capacitor module.

Figure 6:
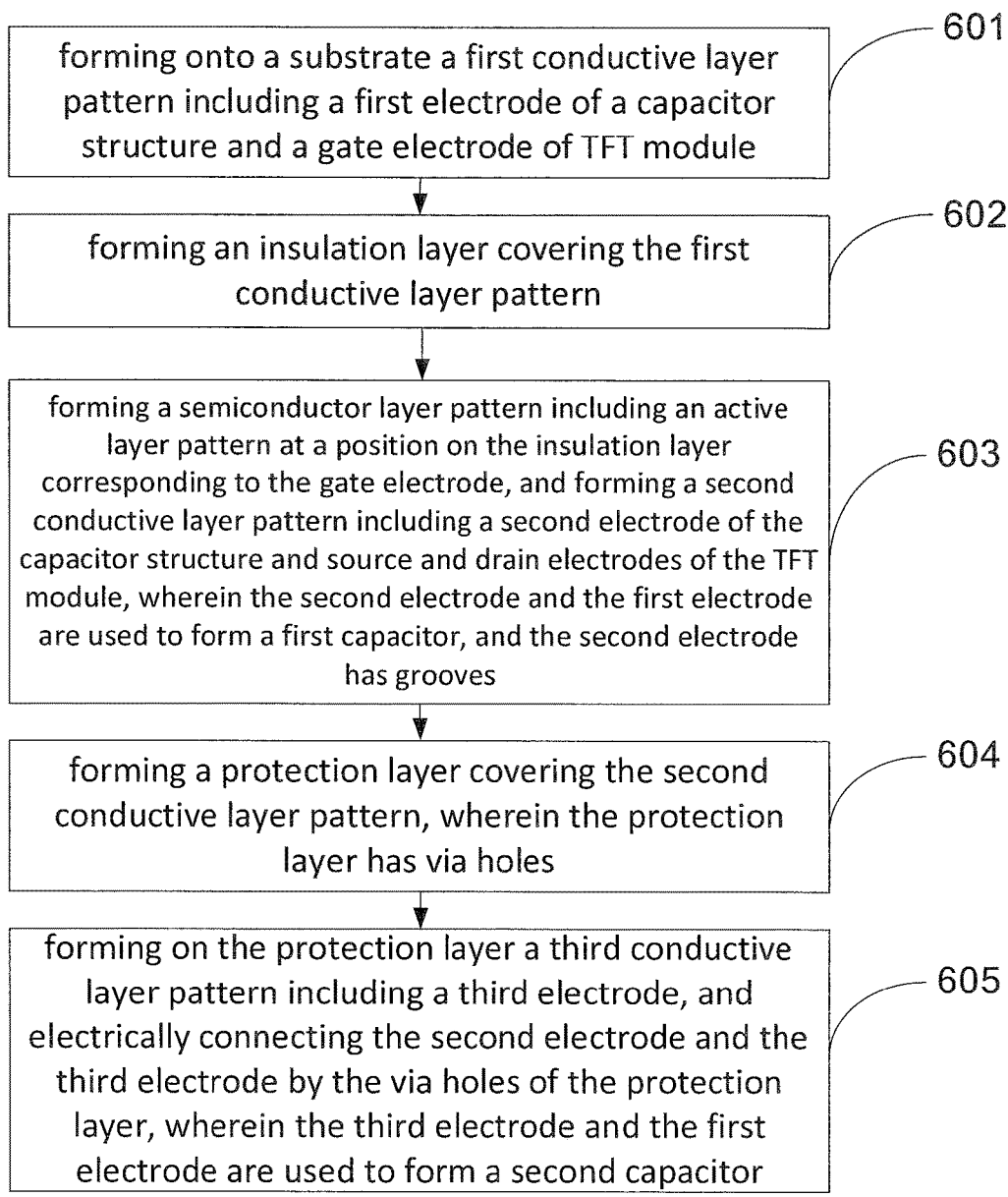
FIG. 6 is a flow chart of a method for producing a GOA unit in accordance with an embodiment of the present application.

Another embodiment of the present application provides a method for producing a GOA unit, as shown in FIG. 6. The TFT herein is of a structure having a bottom gate. The method includes the following steps.

Step 601: forming on a substrate a first conductive layer pattern including a first electrode of a capacitor structure and a gate electrode of a TFT module.

Because there are high content of metallic impurity such as aluminum, barium and sodium or the like in an alkali glass, diffusion of the metallic impurity tends to occur during a high temperature treatment process. Therefore, it is preferable to make the substrate by an alkali-free glass.

Figure 7:
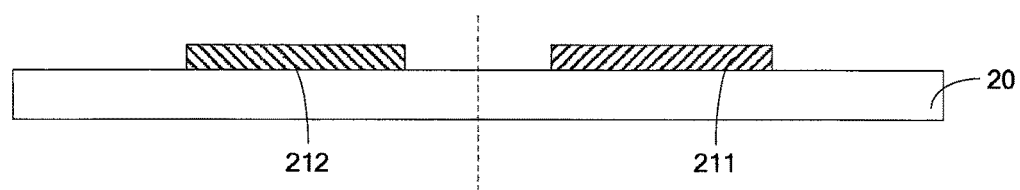
FIG. 7 is a first schematic view for showing a structure of the GOA unit during a process for manufacturing the GOA unit in accordance with an embodiment of the present application.

As shown in FIG. 7, the first conductive layer is produced by a sputtering method or a depositing method on the substrate 20 which has been precleaned. And then, the first conductive layer pattern including the gate electrode 211 and the first electrode 212 is formed by the steps of such as coating the photoresist, using the mask, exposing it to the light, developing and etching or the like. Specifically, the first conductive layer is generally a layer of conductive film. Of course, it may also be a plurality of layers of conductive films. The conductive film is generally made of metallic materials.

There are a plurality of methods for producing the first conductive layer. Illustratively, the film may be deposited by the methods for example, PECVD (Plasma Enhanced Chemical Vapor Deposition), LPCVD (Low Pressure Chemical Vapor Deposition), APCVD (Atmospheric Pressure Chemical Vapor Deposition), ECR-CVD (Electron Cyclotron Resonance-Chemical Vapor Deposition). Embodiments of the present application are not intend to limit the methods for producing the first conductive layer.

Step 602: forming an insulation layer covering the first conductive layer pattern.

Figure 8:
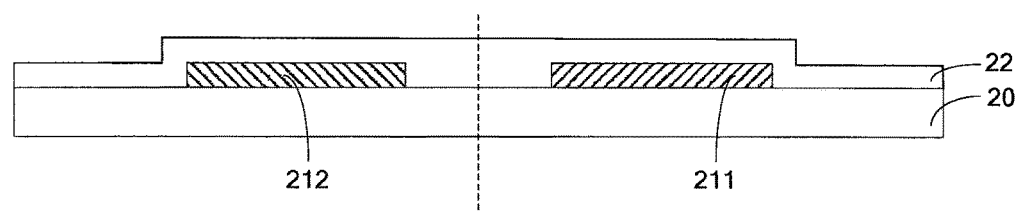
FIG. 8 is a second schematic view for showing a structure of the GOA unit during a process for manufacturing the GOA unit in accordance with an embodiment of the present application.

As shown in FIG. 8, the insulation layer 22 can be deposited and formed onto the substrate 20 provided with the first conductive layer pattern by methods such as PECVD, LPCVD, APCVD, or ECR-CVD. The thickness of the insulation layer 22 may be selected according to the need for specific processes, and the embodiments of the present application are not intended to limit the thickness of the insulation layer 22.

Step 603: forming a semiconductor layer pattern including an active layer pattern at a position on the insulation layer corresponding to the gate electrode, and forming a second conductive layer pattern including a second electrode of the capacitor structure and source and drain electrodes of the TFT module, wherein the second electrode and the first electrode are used to form a first capacitor, and the second electrode has grooves.

As shown in FIG. 4, the semiconductor layer 23 is formed at a position on the insulation layer 22 corresponding to the gate electrode 211, wherein the semiconductor layer 23 is generally an amorphous silicon film or a microcrystalline silicon film. The semiconductor layer pattern may be formed on the semiconductor layer 23 by patterning processes. The conductive layer is formed on the semiconductor layer, and the second conductive layer pattern including the second electrode 243 of the capacitor structure and source and drain electrodes 241 and 242 of the TFT module is formed on the semiconductor layer by patterning processes. The first electrode 212 and the second electrode 243 may be used to form the first capacitor.

Because the second electrode 243 is provided with grooves 2431 thereon, so that during manufacturing the second conductive layer pattern, the developer liquid will flow toward a region corresponding to the grooves 2431 of the second electrode 243, rather than flowing to another region corresponding to channels 244 excessively. Therefore, over development will not occur with respect to the region corresponding to the channels 244, and it would cause the problem that the TFT has too wide channels.

Figure 9:
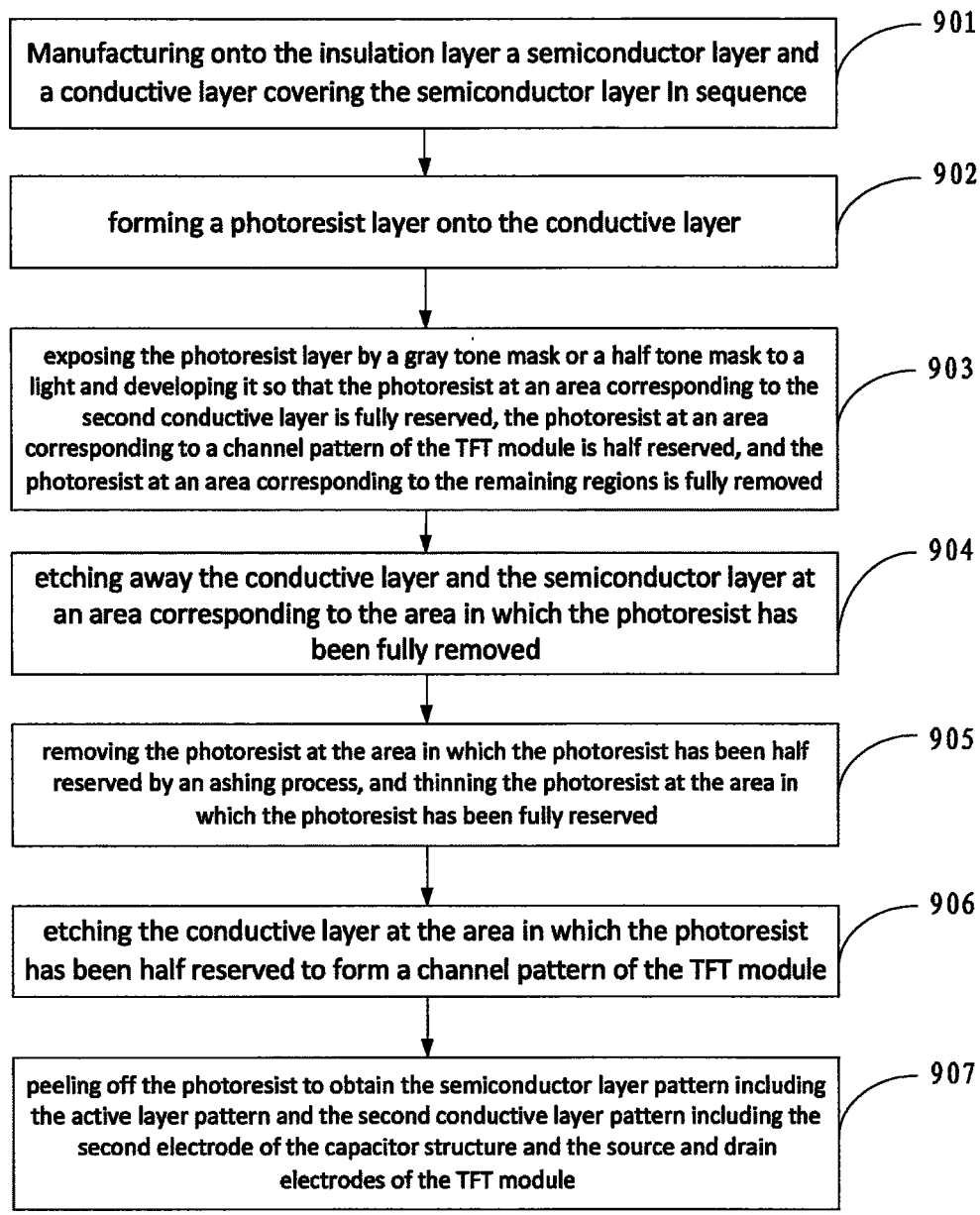
FIG. 9 is a flow chart of a method for producing a semiconductor layer pattern and a second conductive pattern in the GOA unit in accordance with an embodiment of the present application.

As shown in FIG. 9, a specific method for producing the semiconductor layer pattern and the second conductive layer pattern includes the following steps.

Step 901: manufacturing onto the insulation layer a semiconductor layer and a conductive layer covering the semiconductor layer in sequence.

Figure 10:
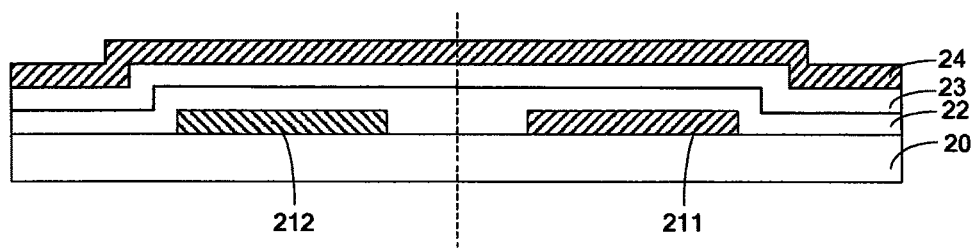
FIG. 10 is a third schematic view for showing a structure of the GOA unit during a process for manufacturing the GOA unit in accordance with an embodiment of the present application.

As shown in FIG. 10, the semiconductor layer 23 and the conductive layer 24 covering the semiconductor layer 23 are deposited in sequence onto the insulation layer 22 by the methods such as PECVD, LPCVD, APCVD, or ECR-CVD. The deposition thickness can be chosen according to the actual conditions, and the embodiments of the present application are not intended to limit the deposition thickness.

Step 902: forming a photoresist layer onto the conductive layer.

Figure 11:
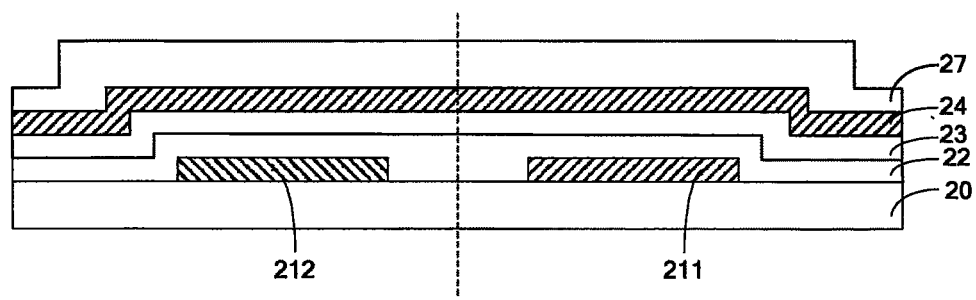
FIG. 11 is a fourth schematic view for showing a structure of the GOA unit during a process for manufacturing the GOA unit in accordance with an embodiment of the present application.

As shown in FIG. 11, after manufacturing the semiconductor layer 23 and the conductive layer 24, the photoresist layer 27 may be coated onto the conductive layer 24. The photoresist layer 27 has a thickness in a range of 10000 to 20000 Å.

Step 903: exposing the photoresist layer by a gray tone mask or a half tone mask to a light and developing it so that the photoresist at an area corresponding to the second conductive layer pattern is fully reserved, the photoresist at an area corresponding to a channel pattern of the TFT module is half reserved, and the photoresist at an area corresponding to the remaining regions is fully removed.

Figure 12:
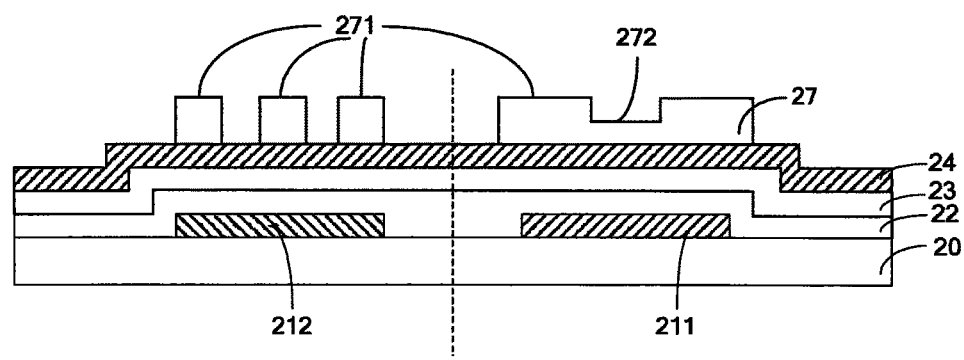
FIG. 12 is a fifth schematic view for showing a structure of the GOA unit during a process for manufacturing the GOA unit in accordance with an embodiment of the present application.

As shown in FIG. 12, after coating the photoresist layer 27, the photoresist layer is exposed to the light by the gray tone mask or the half tone mask, and is developed so that the photoresist at an area 271 corresponding to the second conductive layer pattern is fully reserved, the photoresist at an area 272 corresponding to a channel pattern of the TFT module is half reserved, and the photoresist at an area corresponding to the remaining regions is fully removed. The area 271 corresponding to the second conductive layer pattern is an area corresponding to the second electrode, the source electrode and the drain electrode.

Figure 16:
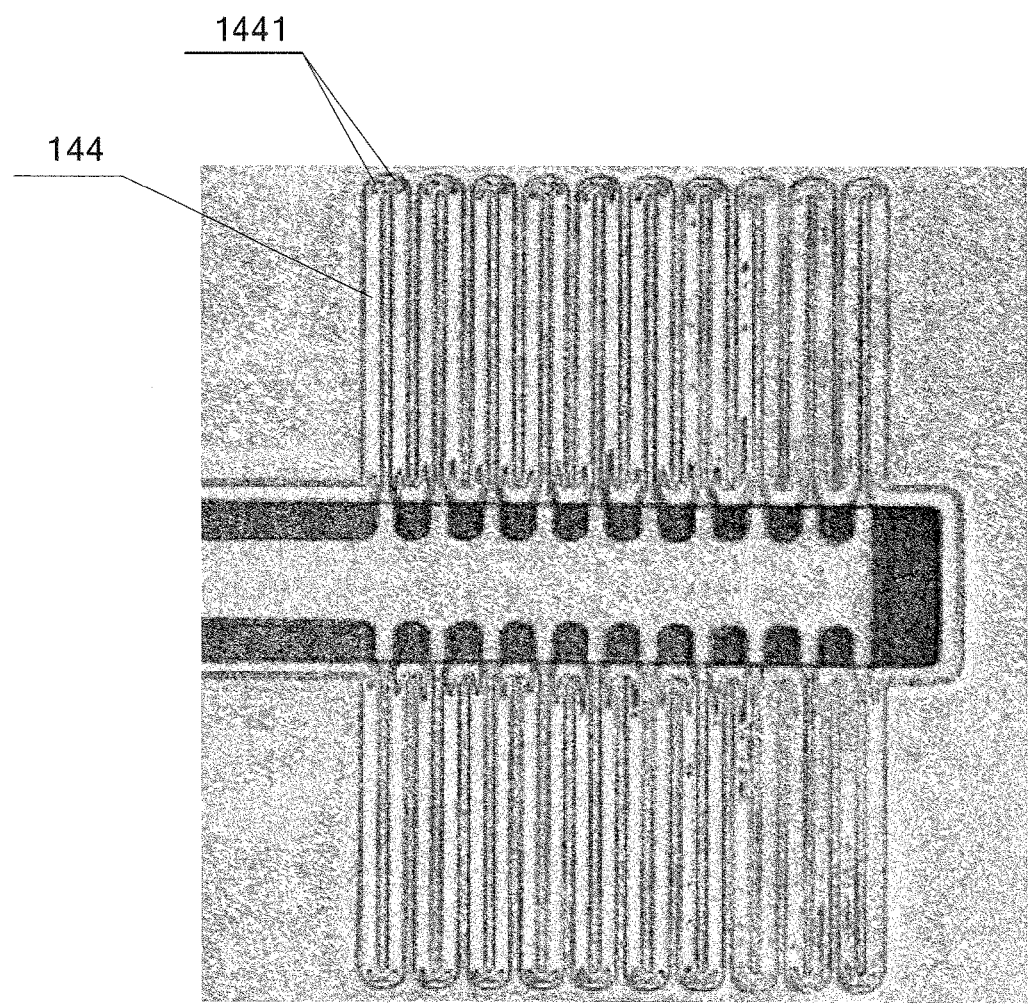
FIG. 16 is a schematic view of a broken channel in the prior art.

In the prior art, when the photoresist layer is exposed to a light by a mask and is developed, as the development operation proceeds, it needs to reduce the thickness of the photoresist at an area corresponding to the channel where the photoresist is half reserved, and to keep the thickness of the photoresist at the area corresponding to the second electrode where the photoresist is fully reserved not to be changed. Because the second electrode has an integral structure of relatively large area, the photoresist at the area corresponding to the second electrode is also of an integral structure. Thus, more developer liquid will flow toward the channel where the thickness of the photoresist is relatively small. It will cause a concentration of the developer liquid at the photoresist of the area corresponding to the channels to increase, and it tends to cause over developing of the photoresist at the area corresponding to the channel, that is, the photoresist at the area corresponding to the channel becomes very thin. For this reason, in the subsequent etching process, the thin photoresist at the area corresponding to the channel cannot resist the etching liquid, and this causes the conductive layer below the photoresist to be etched away, thereby resulting in ashing away the semiconductor layer not protected by the photoresist and the conductive layer during the ashing process. Finally, the channel of the TFT is caused to be broken down. FIG. 16 is a schematic view of breakage of the TFT channel, in which a broken area 1441 of the channel is present.

In the present application, there are grooves on the second electrode to be manufactured, thus, upon exposing, the area corresponding to the grooves will be exposed to a light. In the following developing process, the photoresist at the area corresponding to the grooves will be fully removed. As compared to the area corresponding to the second conductive layer pattern where the photoresist is fully reserved and the area corresponding to the channel pattern where the photoresist is half reserved, a recess will be formed in the area corresponding to the groove. In this way, the developer liquid will flow toward the area corresponding to the groove, but excessive developer liquid does not flow toward the area corresponding to the channel pattern. Therefore, there is no problem that the TFT channel is broken or widened.

Step 904: etching away the conductive layer and the semiconductor layer at an area corresponding to the area in which the photoresist has been fully removed.

Figure 13:
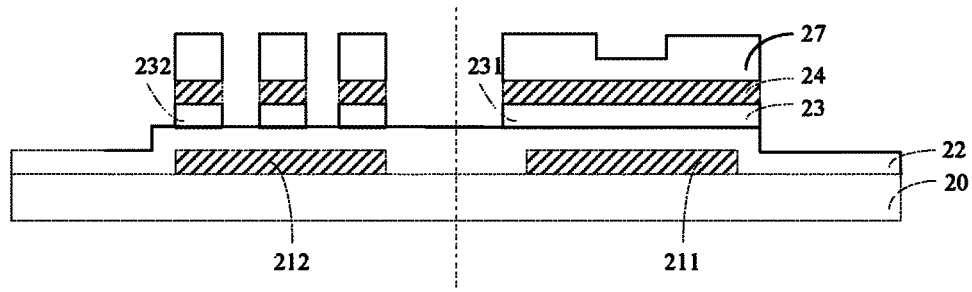
FIG. 13 is a sixth schematic view for showing a structure of the GOA unit during a process for manufacturing the GOA unit in accordance with an embodiment of the present application.

The conductive layer 24 and the semiconductor layer 23 at the area where the photoresist has been fully removed by a wet etching method or a dry etching method. The dry etching method can be selected from a plasma etching method, a reactive ion etching method, and an inductance coupling plasma etching method or the like. The etching gas can be selected from a fluorine containing gas, or a chlorine containing gas, such as $CF_4$, $CHF_3$, $SF_6$, $CC_{12}F_2$, or a mixed gas of the above gas with $O_2$. The GOA unit after etching is shown in FIG. 13.

Step 905: removing the photoresist at the area in which the photoresist has been half reserved by an ashing process, and thinning the photoresist at the area in which the photoresist has been fully reserved.

Figure 14:
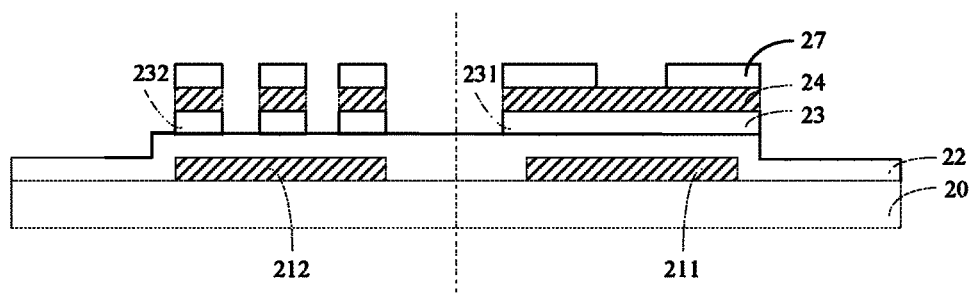
FIG. 14 is a seventh schematic view for showing a structure of the GOA unit during a process for manufacturing the GOA unit in accordance with an embodiment of the present application.

The photoresist can be thinned with a same speed by using the ashing process. An ashing degree is controlled to remove the photoresist where the photoresist is half reserved, whereas the photoresist in the area where the photoresist is fully reserved is thinned with the same degree as described either. The GOA unit after the ashing process is shown in FIG. 14.

Step 906: etching the conductive layer at the area in which the photoresist has been half reserved to form a channel pattern of the TFT module.

Figure 15:
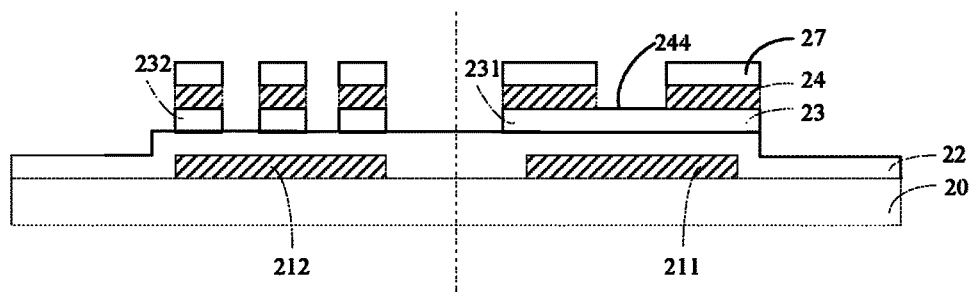
FIG. 15 is an eighth schematic view for showing a structure of the GOA unit during a process for manufacturing the GOA unit in accordance with an embodiment of the present application.

As shown in FIG. 15, the conductive layer 24 at the area where the photoresist has been half reserved is etched away by the wet etching method or the dry etching method, so as to form the channel pattern 244 of the TFT module.

Step 907: peeling off the photoresist to obtain the semiconductor layer pattern including the active layer pattern and the second conductive layer pattern including the second electrode of the capacitor structure and the source and drain electrodes of the TFT module.

As shown in FIG. 4, just after peeling off the remaining photoresist, the second conductive layer pattern including the second electrode 243 of the capacitor structure and the source and drain electrodes 241, 242 of the TFT module is obtained. At this time, the second conductive layer pattern is finished.

Please be noted that as shown in FIG. 6, After forming a semiconductor layer pattern including an active layer pattern at a position on the insulation layer corresponding to the gate electrode and forming a second conductive layer pattern including a second electrode of the capacitor structure and source and drain electrodes of the TFT module, the method for producing the GOA unit also further includes the steps of:

Step 604: forming a protection layer covering the second conductive layer pattern, wherein the protection layer has via holes.

Figure 17:
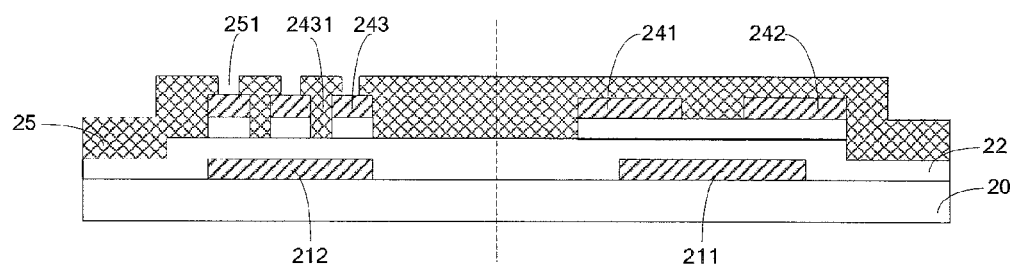
FIG. 17 is a ninth schematic view for showing a structure of the GOA unit during a process for manufacturing the GOA unit in accordance with an embodiment of the present application.

As shown in FIG. 17, the protection layer 25 is formed on the second conductive layer pattern by one patterning process, and the via holes 251 are provided onto the protection layer 25, so as to connect the third electrode located onto the protection 25 with the second electrode 243 by the via holes 251.

Step 605: forming on the protection layer a third conductive layer pattern including a third electrode, and electrically connecting the second electrode and the third electrode by the via holes of the protection layer, wherein the third electrode and the first electrode are used to form a second capacitor;

With reference to FIG. 5, the third conductive layer pattern including the third electrode 26 is formed on the protection layer 25, and the second electrode 243 is electrically connected with the third electrode 26 by the via holes 251. Since a plurality of grooves 2431 are provided onto the second electrode 243, and the area of the grooves 2431 and the first electrode 212 cannot constitute a capacitor structure, thereby causing the first capacitor formed by the first electrode 212 and the second electrode 243 to be relatively small. By providing the third electrode 26 and forming the second capacitor by the first electrode 212 and the third electrode 26, the second capacitor is added so as to ensure the capacitance of the entire capacitor module.

Figure 18:
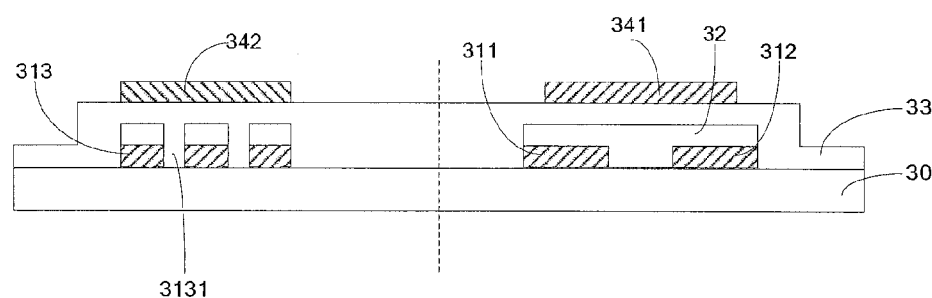
FIG. 18 is a schematic view for showing a structure of the GOA unit during a manufacturing process in accordance with another embodiment of the present application.

A further embodiment of the present application provides a GOA unit, as shown in FIG. 18. The GOA unit includes a TFT module and a capacitor structure formed on the substrate 30. The TFT in the TFT module is of a top gate structure. The TFT module includes a gate electrode 341, a source electrode 311 and a drain electrode 312. The capacitor structure includes a first electrode 342 and a second electrode 313 for forming the first capacitor. The gate electrode 341 of the TFT module is located in the same layer as the first electrode 342 of the capacitor structure. The source electrode 311 and the drain electrode 312 of the TFT module are located in the same layer as the second electrode 313 of the capacitor structure, and the second electrode 313 has grooves 3131.

The substrate 30 may be a transparent substrate made of materials such as glass or transparent resin. The present application is not intended to limit the material of the substrate 30. Of course, the substrate 30 further includes a film layer for example an insulation layer on the transparent substrate, according to needs for design and manufacturing.

The above groove 3131 can be a groove having a side wall to be open at one end thereof as shown in FIG. 18. Of course, it may also be a groove having a side wall to be closed. In addition, an embodiment of the present application is not intended to limit a shape and an area of the groove 3131 in any ways. Illustratively, the groove may be a cuboid, a cube or a trapezoid platform and the like. That as shown in FIG. 18 is only one of all possible shapes.

In this way, as compared with the prior art, an embodiment of the present application provides the GOA unit, the second electrode of which is provided with grooves, so that during manufacturing the second electrode, when the photoresist layer corresponding to the second electrode is exposed to the light by a mask and is developed, the developer liquid will flow toward a photoresist region corresponding to the grooves of the second electrode, rather than flowing to another photoresist region corresponding to channels excessively. Therefore, excessive developer liquid will not be accumulated at the region corresponding to the channel, and further the photoresist at the region corresponding to the two sides of the channels would not be developed by excessive developer liquid. Thus, it can prevent the problem that the TFT has too wide channels.

Figure 19:
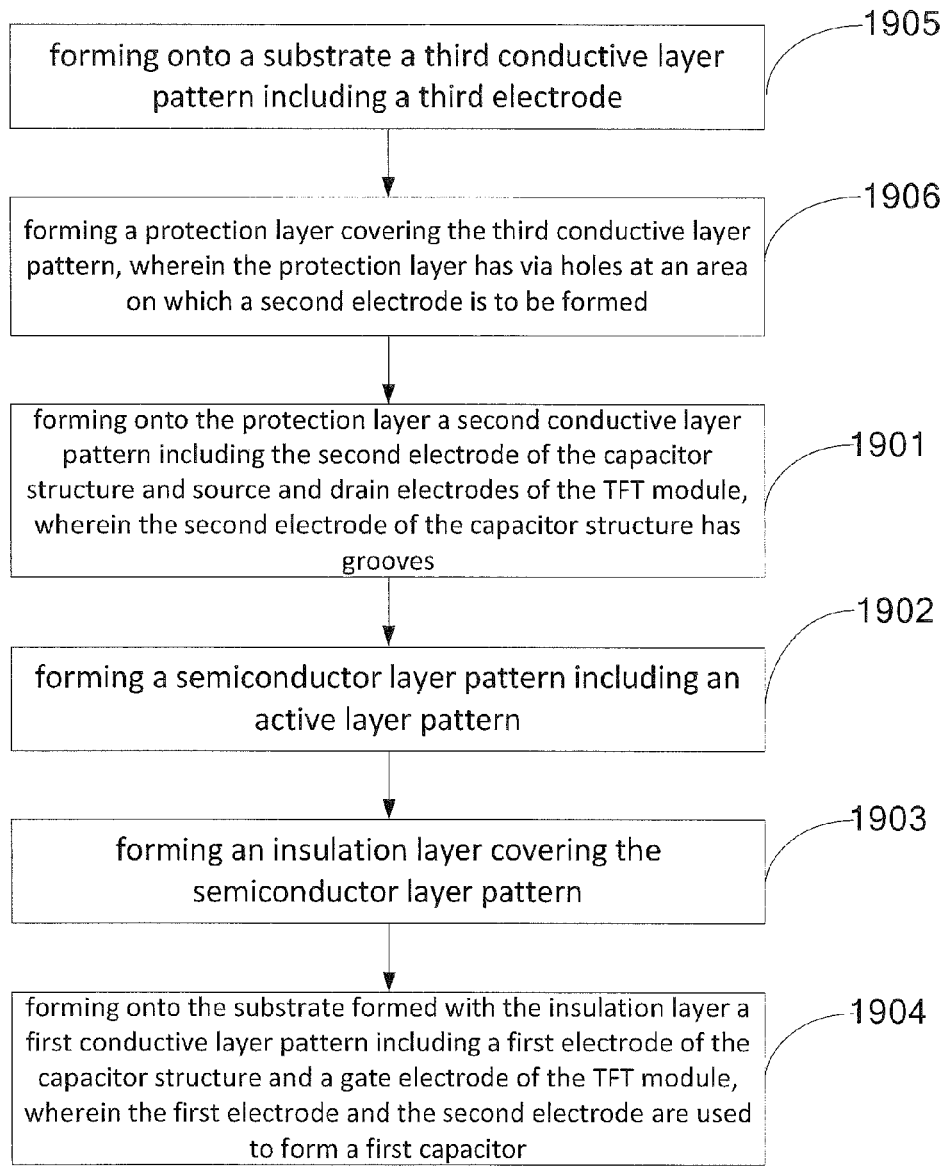
FIG. 19 is a flow chart of a method for producing a GOA unit in accordance with a yet further embodiment of the present application.

A method for producing a GOA unit having TFT of a top gate structure is described below, as shown in FIG. 19. The method includes the following steps.

Step 1901: forming onto a substrate a second conductive layer pattern including the second electrode of the capacitor structure and source and drain electrodes of the TFT module, wherein the second electrode of the capacitor structure has grooves.

With reference to FIG. 18, the second conductive layer pattern including the second electrode 313 and source and drain electrodes 311, 312 of the TFT module is formed by one patterning process on the substrate 30. Because the second electrode 313 has grooves 3131, during manufacturing the second electrode 313, in exposing and developing processes, excessive developer liquid will flow toward a region corresponding to the grooves, rather than flowing to another region corresponding to channel pattern between the source electrode 311 and the drain electrode 312. Therefore, problem that the TFT channel is broken or widened will not occur.

Step 1902: forming a semiconductor layer pattern including an active layer pattern.

With reference to FIG. 18, after finishing the second conductive layer pattern, the semiconductor layer 32 is deposited and formed so as to manufacture the semiconductor layer pattern. The semiconductor layer 32 may be such as an amorphous silicon film or a microcrystalline silicon film. The present embodiment is not intended to limit the material of the semiconductor 32.

Step 1903: forming an insulation layer covering the semiconductor layer pattern.

The insulation layer 33 is deposited onto the semiconductor layer pattern, wherein the deposition method is one of PECVD, LPCVD, APCVD, and ECR-CVD. The present embodiment is not intended to limit the deposition method.

Step 1904: forming onto the substrate formed with the insulation layer a first conductive layer pattern including a first electrode of the capacitor structure and a gate electrode of the TFT module, wherein the first electrode and the second electrode are used to form a first capacitor.

As shown in FIG. 18, the first conductive layer pattern including the first electrode 342 of the capacitor structure and the gate 341 of the TFT module may be manufactured onto the insulation layer 33 by one patterning process, wherein the first electrode 342 and the second electrode 313 are used to form the first capacitor.

Please be noted that with reference to FIG. 19, before forming on the substrate the second conductive layer pattern including the second electrode of the capacitor structure and the source electrode and the drain electrode of the TFT module, the method for producing the GOA unit may further include the following steps:

Step 1905: forming onto the substrate a third conductive layer pattern including a third electrode.

Figure 20:
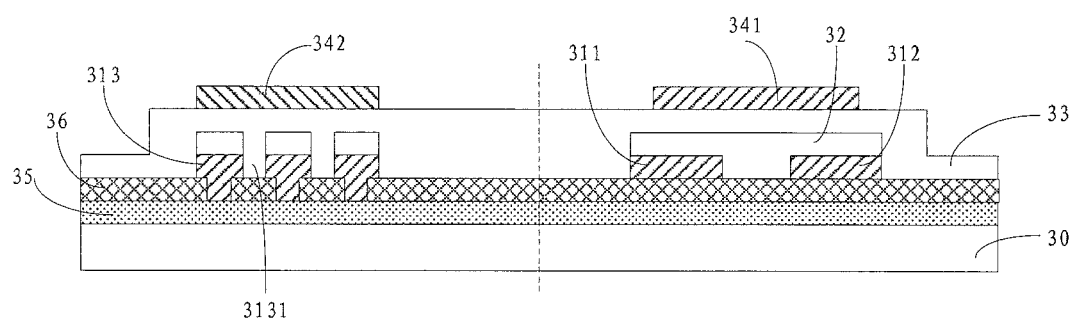
FIG. 20 is a schematically sectional view for showing a GOA unit in accordance with another embodiment of the present application.

As shown in FIG. 20, the third conductive layer pattern including the third electrode 35 is formed on the substrate 30. The substrate 30 may be made of an alkali-free glass, and the third electrode 35 may be made of the ITO material.

Step 1906: forming a protection layer covering the third conductive layer pattern, wherein the protection layer has via holes at an area on which a second electrode is to be formed.

As shown in FIG. 20, the protection layer 36 is provided on the third conductive layer pattern, and the via holes are provided on the protection layer 36. The second electrode 313 is connected with the third electrode 35 by the via holes. Because the grooves 3131 is provided on the second electrode 313, this causes the first capacitor formed between the first electrode 342 and the second electrode 313 to be relatively small. The first electrode 342 and the third electrode 35 may also constitute a second capacitor, thus the second capacitor can compensate capacitance reduction caused by the grooves 3131, so as to ensure the capacitance of the capacitor structure in the GOA unit.

Figure 21:
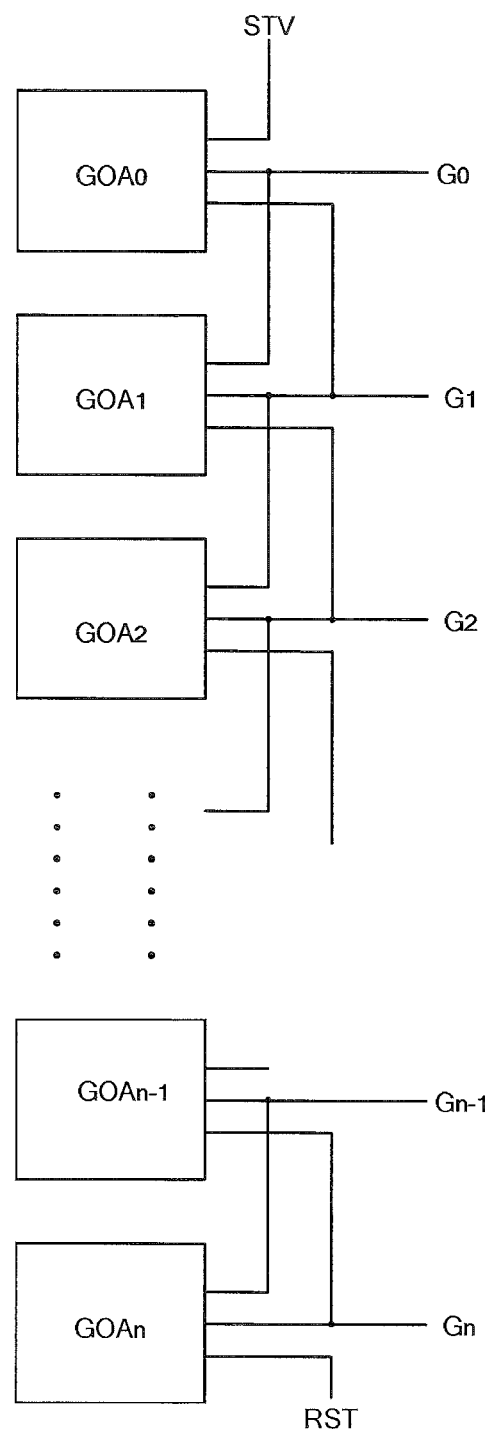
FIG. 21 is a schematic view for showing a structure of a gate driver circuit in accordance with an embodiment of the present application.

A further embodiment of the present application provides a gate driver circuit, as shown in FIG. 21. It includes the GOA unit having any feature as described in the above embodiments, and they are not repeated herein again.

As shown in FIG. 21, the gate driver circuit includes multiple stages of the GOA units as described above. Each stage of GOA unit outputs a row scanning signal Gn(n=0, 1, 2, . . . ) of the current stage GOA unit at an output end thereof. Apart from a first stage of GOA unit GOA0, each of the remaining GOA units has a first signal input end which is connected to the current stage signal output end of the previous stage GOA unit adjacent to it. Apart from the last stage of GOA unit GOAn, each of the remaining GOA units has the current stage signal output end which is connected to the first signal input end of the next stage of GOA unit adjacent to it.

In the present embodiment, the first signal input end of the first stage GOA unit GOA0 can be inputted with a frame start signal STV; a second signal input end of the last stage GOA unit GOAn can be inputted with a reset signal RST, or the output of the last stage of GOA unit GOAn is served as the reset signal RST of the current stage.

A yet further embodiment of the present application provides a display apparatus, including any feature of the gate driver circuit as described above. The display apparatus can be a liquid crystal display apparatus or an OLED display apparatus. The above liquid crystal display apparatus can be any product or component having display function such as a liquid crystal display device, a liquid crystal television, a mobile phone, or a flat panel computer. The present application is not intended to limit the display device.

As described above, these embodiments are only the specific examples of the present application, but the scope of the present application is not limited to this. Any skilled person in the art can easily conceive changes or replacement from the disclosure of the present application, which shall be covered by the scope of the present application. Therefore, the scope of the present application should be defined by the appended claims.

What is claimed is:

1. A gate driver on array (GOA) unit comprising:
   a TFT module and a capacitor structure formed on a substrate, wherein the TFT module comprises a gate electrode, a first portion of an insulation layer, a first portion of a semiconductor layer, a source electrode and a drain electrode, and the capacitor structure comprises a first electrode, a second portion of the insulation layer, a second portion of the semiconductor layer and a second electrode configured to form a first capacitor;
   wherein the gate electrode of the TFT module is located in a same layer as the first electrode of the capacitor structure, the source electrode and the drain electrode of the TFT module are located in a same layer as the second electrode of the capacitor structure, and the second electrode has at least one through groove which extends from the top of the second electrode through the second portion of the semiconductor layer and exposes the second portion of the insulation layer;
   wherein a surface of the second electrode away from the first electrode is formed with a protection layer and a third electrode in sequence, the protection layer is provided with a via hole therein, and the second electrode is electrically connected with the third electrode by the via hole.

2. The GOA unit according to claim 1, wherein a plurality of channels are disposed between the source electrode and drain electrode, the second electrode has a plurality of the through grooves, and a distribution density of the plurality of through grooves is equivalent to that of channels of the TFT module.

3. The GOA unit according to claim 2, wherein the plurality of through grooves are distributed evenly.

4. The GOA unit according to claim 2, wherein a surface of the second electrode away from the first electrode is formed with a protection layer and a third electrode in sequence, the protection layer is provided with a via hole therein, and the second electrode is electrically connected with the third electrode by the via hole.

5. The GOA unit according to claim 3, wherein a surface of the second electrode away from the first electrode is formed with a protection layer and a third electrode in sequence, the protection layer is provided with a via hole therein, and the second electrode is electrically connected with the third electrode by the via hole.

6. The GOA unit according to claim 1, wherein the third electrode is made of ITO material.

7. The GOA unit according to claim 4, wherein the third electrode is made of ITO material.

8. A gate driver circuit, comprising a plurality of the GOA units according to claim 1.

9. The gate driver circuit according to claim 8, wherein a plurality of channels are disposed between the source electrode and drain electrode, the second electrode has a plurality of the through grooves, and a distribution density of the plurality of through grooves is equivalent to that of channels of the TFT module.

10. The gate driver circuit according to claim 9, wherein the plurality of through grooves are distributed evenly.

11. The gate driver circuit according to claim 8, wherein a surface of the second electrode away from the first electrode is formed with a protection layer and a third electrode in sequence, and the protection layer is provided with a via hole therein, and the second electrode is electrically connected with the third electrode by the via hole.

12. The gate driver circuit according to claim 9, wherein a surface of the second electrode away from the first electrode is formed with a protection layer and a third electrode in sequence, the protection layer is provided with a via hole therein, and the second electrode is electrically connected with the third electrode by the via hole.

13. The gate driver circuit according to claim 10, wherein a surface of the second electrode away from the first electrode is formed with a protection layer and a third electrode in sequence, the protection layer is provided with a via hole therein, and the second electrode is electrically connected with the third electrode by the via hole.

* * * * *